(12) United States Patent
Shirashima

(10) Patent No.: US 10,639,674 B2
(45) Date of Patent: May 5, 2020

(54) RESPONSE FORCE GENERATION DEVICE

(71) Applicant: ALPINE ELECTRONICS, INC., Shinagawa-ku, Tokyo (JP)

(72) Inventor: Hitoshi Shirashima, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 217 days.

(21) Appl. No.: 16/011,851

(22) Filed: Jun. 19, 2018

(65) Prior Publication Data

US 2019/0054500 A1 Feb. 21, 2019

(30) Foreign Application Priority Data

Aug. 17, 2017 (JP) ................................ 2017-157434

(51) Int. Cl.
| | |
|---|---|
| *B06B 1/04* | (2006.01) |
| *G06F 3/01* | (2006.01) |
| *H03K 4/08* | (2006.01) |
| *H03K 4/94* | (2006.01) |
| *G06F 3/041* | (2006.01) |
| *B06B 1/02* | (2006.01) |
| *G06F 3/044* | (2006.01) |

(52) U.S. Cl.
CPC ............ *B06B 1/045* (2013.01); *B06B 1/0215* (2013.01); *G06F 3/016* (2013.01); *G06F 3/041* (2013.01); *H03K 4/08* (2013.01); *H03K 4/94* (2013.01); *G06F 3/044* (2013.01); *G06F 2203/04105* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,619,073 | B2* | 4/2017 | Shin | ...................... G06F 3/0416 |
| 9,891,708 | B2 | 2/2018 | Cruz-Hernandez et al. | |
| 2002/0149561 | A1 | 10/2002 | Fukumoto | |
| 2004/0008105 | A1 | 1/2004 | Rota et al. | |
| 2006/0290662 | A1* | 12/2006 | Houston | .................. A63F 13/06 |
| | | | | 345/156 |
| 2008/0158175 | A1* | 7/2008 | Hotelling | .............. G06F 3/0418 |
| | | | | 345/173 |

FOREIGN PATENT DOCUMENTS

| | | |
|---|---|---|
| JP | 4560388 | 7/2010 |
| JP | 2010-287232 | 12/2010 |
| JP | 2012-055852 | 3/2012 |

OTHER PUBLICATIONS

Extended European Search Report for 18186971.0 dated Dec. 19, 2018, 7 pgs.

* cited by examiner

*Primary Examiner* — Emily P Pham
(74) *Attorney, Agent, or Firm* — Brinks Gilson & Lione

(57) ABSTRACT

A drive waveform setting unit sets a drive waveform of a drive signal, and a drive current is applied to a drive coil provided in a response force generation mechanism in accordance with the drive waveform. The drive waveform has a first drive section in which a signal intensity increases linearly and a second drive section including a peak. An increase rate of the signal intensity in the second drive section is lower than that in the first drive section. As a result, it is easy to follow the frequency characteristics of a driver circuit, and it is possible to increase a voltage to be applied to a drive coil.

15 Claims, 6 Drawing Sheets

RESPONSE FORCE GENERATION DEVICE

RELATED APPLICATION

The present application claims priority to Japanese Patent Application Number 2017-157434, filed Aug. 17, 2017, the entirety of which is hereby incorporated by reference.

BACKGROUND

1. Field of the Invention

The present invention relates to a response force generation device that utilizes a response force generation mechanism to apply a response force to a member to be operated when an operation unit provided with the member to be operated is operated with a finger or the like.

2. Description of the Related Art

JP 2006-150865 A describes technology relating to an image forming device having an operation panel vibration means configured to vibrate a touch panel.

This image forming device has an LCD and a touch panel positioned on the LCD, and a key is displayed on the LCD. When a key selection detection means detects that the touch panel is pressed with a finger or the like as the key displayed on the LCD is selected, the selected key is analyzed by a CPU. Based on this analysis, a time at which vibration is started is set by a vibration start time setting means, a vibration frequency is set by a vibration frequency setting means, and a vibration waveform is set by a vibration waveform setting means, whereby vibration is applied to the touch panel.

As illustrated in FIG. 2 of JP 2006-150865 A, the vibration waveform setting means sets a vibration waveform of a sine wave, a vibration waveform of a rectangular wave, or a vibration waveform of a triangular wave.

When the mass of an operation panel formed of the LCD and the touch panel is relatively small, it is possible to make the finger touching the touch panel relatively easily feel a response force with respect to the pressing of the touch panel by using the vibration waveform of the sine wave or the rectangular wave and properly setting the vibration frequency. However, when it is desired to apply a large response force to the operation panel having a relatively large mass, or when it is desired to apply a large operation reaction force similar to a response force when a mechanical switch is pressed to an operating finger, the vibration waveform of the sine wave or the rectangular wave is often insufficient.

In order to apply a response force having a large acceleration to the operation panel, it is preferable to select a triangular wave as the vibration waveform, to increase the vibration frequency of the triangular wave, and to increase the amplitude of the triangular wave. However, if the frequency of a drive waveform of a triangular wave is increased and a waveform of a peak portion of the triangular wave is set to a sharp shape, it is difficult for the frequency characteristic of a driver circuit (power amplifier) provided in the operation panel vibration means to follow a change in the intensity of a peak region of the triangular wave in the drive waveform, and a growth of a voltage acting on a drive coil is more likely to become stunted in the vicinity of the peak of the triangular wave. In addition, it is difficult to apply a sufficient acceleration to a movable portion in a vibration generation unit due to the influence of an impedance of the drive coil provided in the vibration generation unit, an inertia force of the movable portion to be operated by the drive coil, and the like.

SUMMARY

The present disclosure has been made to solve the above-described conventional problems, and an object thereof is to provide a response force generation device capable of causing a response force of a large acceleration to act on a member to be operated with a large amplitude from a response force generation mechanism.

The present disclosure relates to a response force generation device including: a response force generation mechanism which is attached to a member to be operated at least a part of which is configured as an operation unit and applies a response force to the member to be operated; and a drive control unit configured to drive the response force generation mechanism, in which the response force generation mechanism has a movable portion and a magnetic drive unit configured to operate the movable portion, the drive control unit sets a drive waveform for changing a signal intensity of a drive signal to be supplied to the magnetic drive unit, and the drive waveform has a first drive section in which the signal intensity increases in accordance with a lapse of time and a second drive section including a peak of the signal intensity, and the second drive section includes a region in which an increase rate of the signal intensity with respect to time is lower than an increase rate of the first drive section.

In the response force generation device of the present disclosure, it is preferable that the drive signal change linearly in the first drive section.

In the response force generation device of the present disclosure, for example, a waveform of the drive signal is a rectangular wave in the second drive section. That is, the second drive section can be configured to include a region in which the intensity of the drive signal does not change.

In the response force generation device of the present disclosure, the second drive section may include a region in which the intensity of the drive signal changes in a curve.

In the response force generation device of the present disclosure, the increase rate of the signal intensity with respect to time is set to be lower than that of the first drive section in the second drive section including the peak of the drive signal to be applied to the magnetic drive unit of the response force generation mechanism. Thus, when the signal intensity reaches the peak, the follow-up characteristics of a driver including a power amplifier to the drive signal become favorable, so that it is possible to apply a high peak voltage to a drive coil of the magnetic drive unit. Thus, it is possible to apply a drive force of a large acceleration to the movable portion of the response force generation mechanism and the member to be operated with a relatively large amplitude, and it is possible to apply a responsive force with a sharp change in force to the member to be operated.

Therefore, even if the mass of the member to be operated is relatively large, it is possible to apply a sharp response force to the operating finger.

DETAILED DESCRIPTION OF THE PREFERRED EMBODIMENTS

Figure 1:
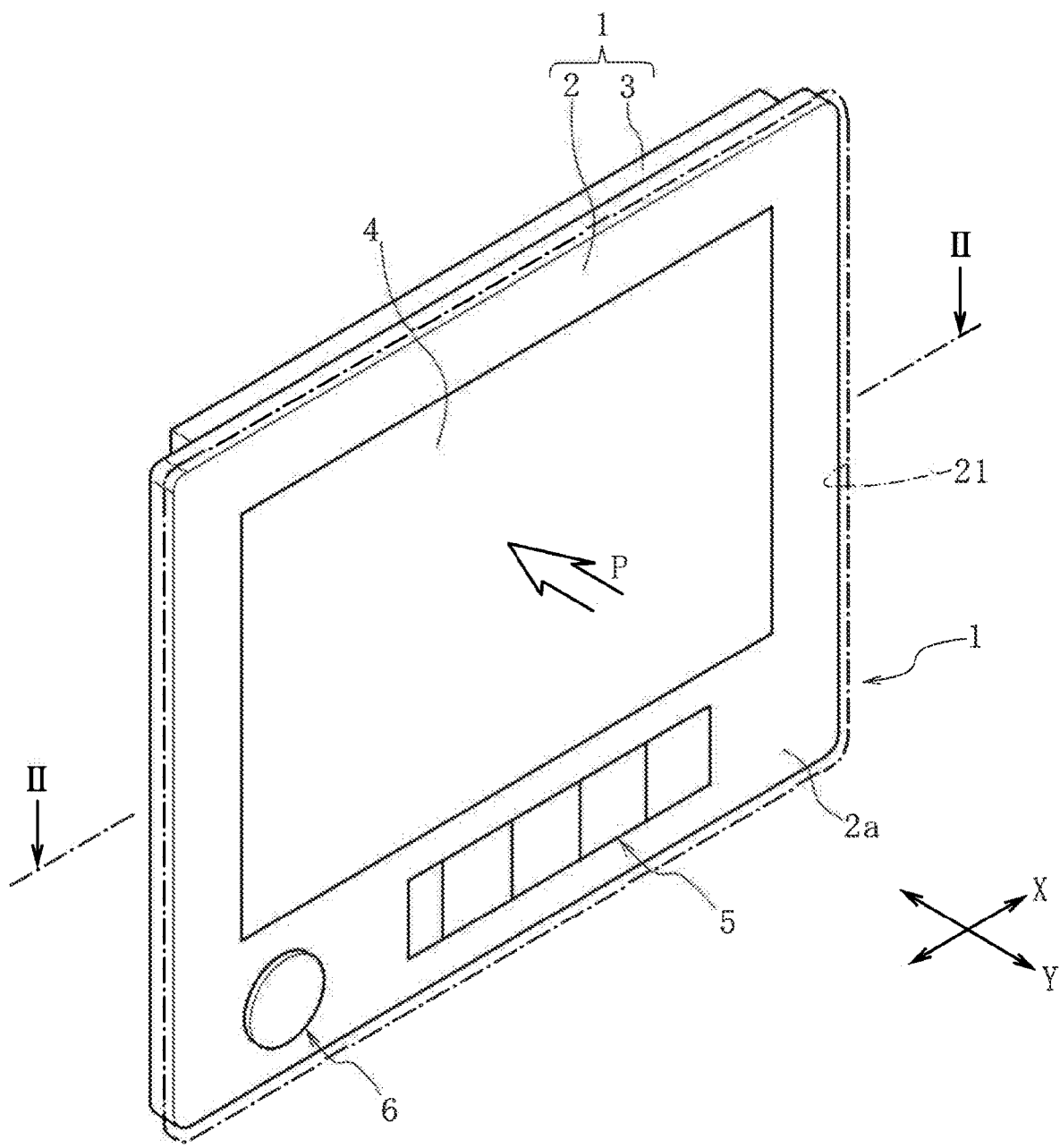
FIG. 1 is an external perspective view illustrating an embodiment of the present invention and illustrating a display/operation device as an example of a member to be operated.
Figure 2:
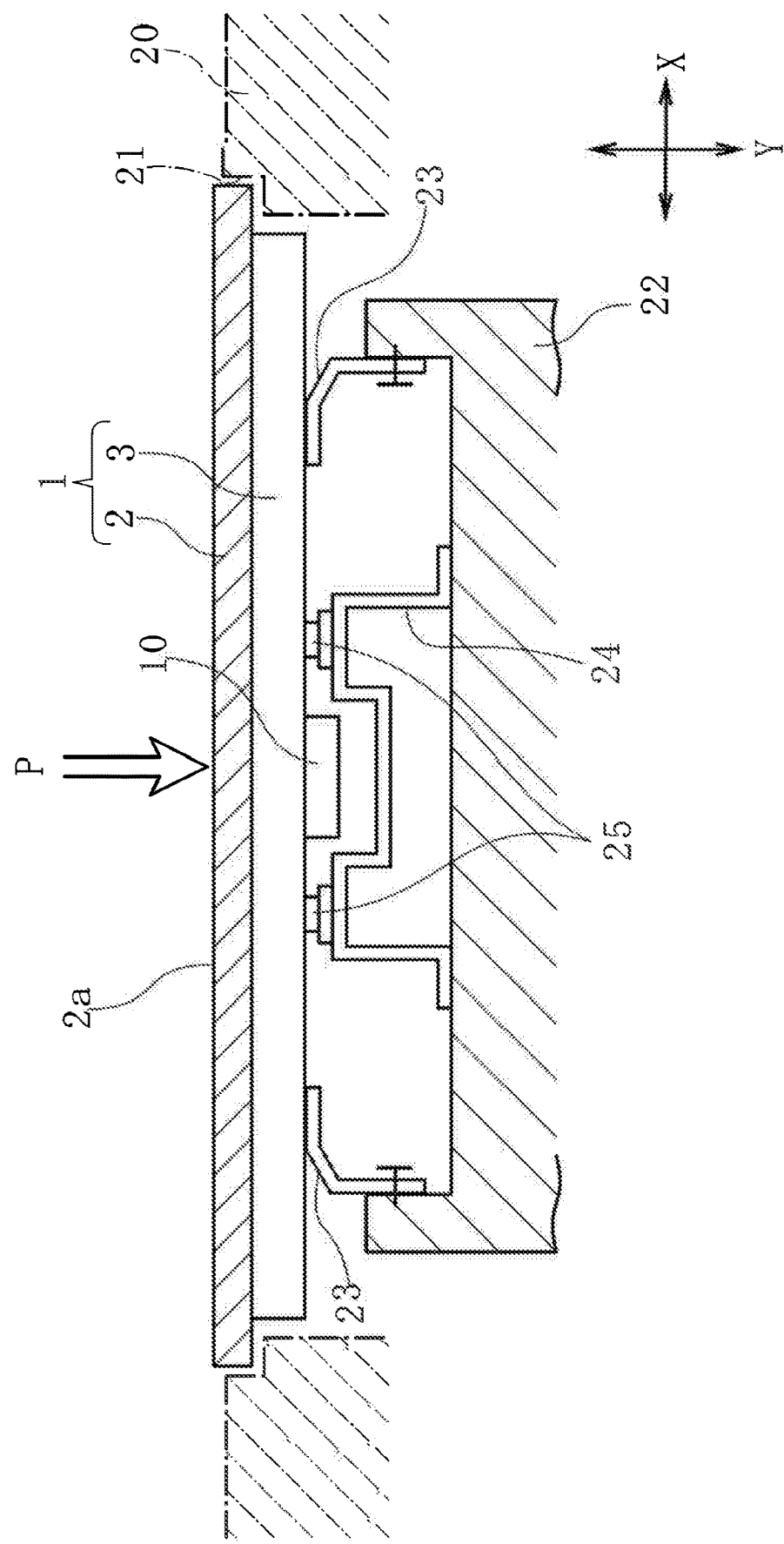
FIG. 2 is a cross-sectional view illustrating a state where the display/operation device illustrated in FIG. 1 is attached to an instrument panel of an automobile and obtained by cutting FIG. 1 along a line II-II.
Figure 3:
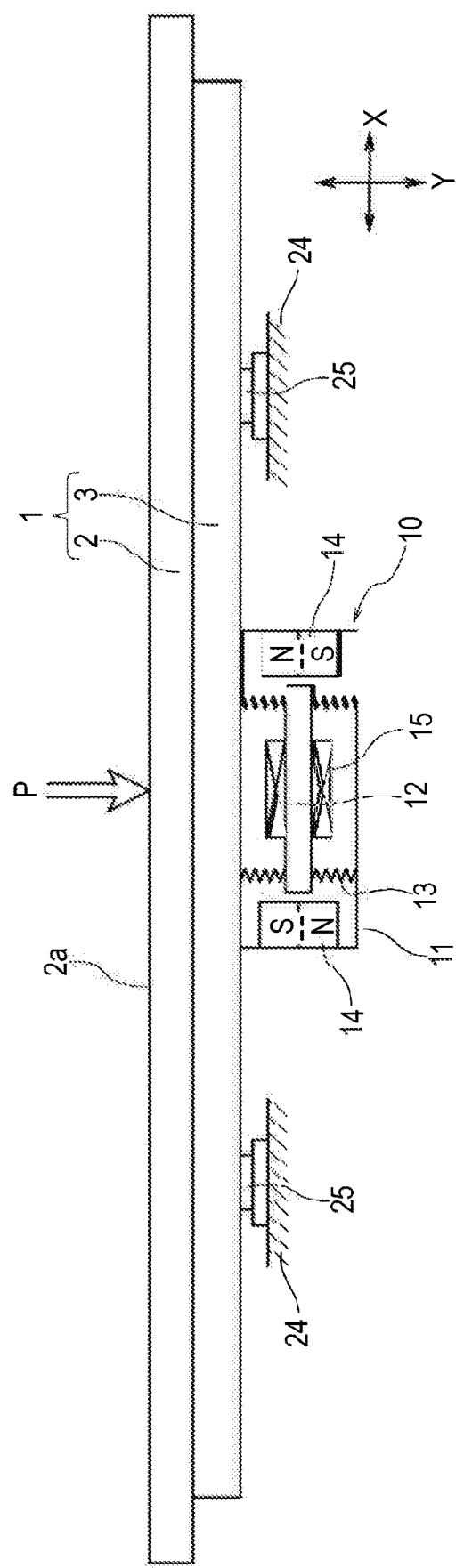
FIG. 3 is an explanatory view schematically illustrating a structure of a response force generation mechanism attached to the display/operation device which is the member to be operated.

FIGS. 1, 2, and 3 illustrate a display/operation device 1 as an example of a member to be operated on and to which a response force generation device according to an embodiment of the present invention is mounted. The display/operation device 1 is mounted in a vehicle.

The display/operation device 1, which is the member to be operated, has a panel portion 2 on the front side and a casing portion 3 on the rear side. A front surface of the panel portion 2 is configured as a decorative surface 2a. A display panel such as a color liquid crystal display panel or an electroluminescence display panel is housed inside the casing portion 3 and a display screen 4 provided on the display panel appears at a central portion of the decorative surface 2a.

A transparent touch sensor is superimposed on a surface of the display screen 4, and at least a part of the display screen 4 is configured as an operation unit. The touch sensor is a capacitive sensor in which a plurality of transparent electrodes are provided on a transparent substrate. When a human finger touches the display screen 4, an electrostatic capacitance detected by the electrode changes, and a position touched by the finger is detected. Alternatively, the touch sensor is a resistive sensor in which a transparent film having a transparent electrode formed on the entire surface thereof is superimposed on a transparent substrate similarly having a transparent electrode formed on the entire surface thereof. When any point of the transparent film is pressed in the resistive sensor, the transparent electrode formed on the transparent film and the transparent electrode formed on the transparent substrate are short-circuited, a change in a resistance value from an electrode portion provided at an edge of the transparent electrode to a short-circuited portion is detected, and a position touched by a finger is determined.

As illustrated in FIG. 1, operation units 5 and 6 are provided on the decorative surface 2a of the panel portion 2 in a region in which the display screen 4 is not provided. The operation units 5 and 6 are configured using thin film switches obtained by providing electrodes on opposing faces of a substrate and a surface film, the surface and the surface film facing each other. Alternatively, capacitive or resistive touch sensors similar to that arranged on the front side of the display screen 4 may be provided in the operation units 5 and 6.

The casing portion 3 is a metal case made of a rolled steel plate, aluminum, or the like, and the panel portion 2 is fixed to the front of the casing portion 3 with screws or the like. The display panel, a circuit board, and the like are housed inside the casing portion 3.

As illustrated in FIG. 3, the response force generation mechanism 10 is fixed to a back surface of the casing portion 3 of the display/operation device 1. Alternatively, the response force generation mechanism 10 is fixed inside the casing portion 3.

The response force generation mechanism 10 has a housing 11 which is fixed to the casing portion 3. The housing 11 is a box made of a sheet metal material. A movable portion 12 having a predetermined mass is provided inside the housing 11. The movable portion 12 is supported by an elastic support member 13 so as to be movable in a direction (Y direction) orthogonal to a plane direction of the decorative surface 2a of the panel portion 2. The movable portion 12 is made of a magnetic metal material such as a Ni—Fe alloy. The elastic support member 13 is a leaf spring or a compression coil spring made of a nonmagnetic material. A pair of magnets 14 opposing both longitudinal end portions (both end portions facing an X direction) of the movable portion 12 are fixed inside the housing 11.

In each of the pair of magnets 14, an opposing surface facing the movable portion 12 is a magnetized face. The magnetized face is magnetized with a N pole and a S pole divided in the Y direction. On the magnetized faces of the pair of magnets 14, magnetic poles opposite to each other oppose each other in the X direction. A drive coil 15 is wound around the movable portion 12, and a magnet drive unit is constituted by the magnets 14 and the drive coil 15.

In FIGS. 1 to 3, an operation direction P using a finger is indicated by an arrow. When the panel portion 2 is pressed in the direction P with the finger, a drive current flows through the drive coil 15 in the response force generation mechanism 10, the movable portion 12 is driven in the Y direction, and as a reaction force thereof, a response force whose direction of force is the Y direction is applied to the display/operation device 1. Incidentally, the movable portion 12 may be driven in the X direction, and a response force whose direction of force is the X direction may be applied to the display/operation device 1 in a magnetic drive mechanism.

The display/operation device 1 is installed in an instrument panel 20 of the vehicle. As illustrated in FIGS. 1 and 2, a rectangular opening 21 is formed in the instrument panel 20, and the display/operation device 1 is installed inside the opening 21. As illustrated in FIG. 2, a base 22 is provided inside the opening 21 of the instrument panel 20. The base 22 is a part of a vehicle body structural portion or an internal structural portion of the instrument panel 20. The casing portion 3 of the display/operation device 1 is supported by a plurality of support metal plates (support members) 23 in front of the base 22. A support metal plate 23 is made of a metal plate having a certain degree of elasticity, and is made of, for example, a cold-rolled steel plate or a stainless steel plate. Due to the elastic deformation of the support metal plate 23, the display/operation device 1 slightly moves in the Y direction.

As illustrated in FIGS. 2 and 3, a metal bracket 24 is fixed to the base 22, and a plurality of detection members 25 are attached to a face of the metal bracket 24 facing the front side in the Y direction. The detection member 25 is a force sensor or a proximity sensor. The force sensor is constituted by an elastically deforming portion that deforms by receiving an operating force P acting on the display/operation device 1 and a strain gauge that detects deformation of the elastically deforming portion. The proximity sensor is constituted by a magnet provided on a back surface of the casing portion 3 and a magnetic sensor provided on the metal bracket 24 and detecting a change in distance with respect to the magnet.

Figure 4:
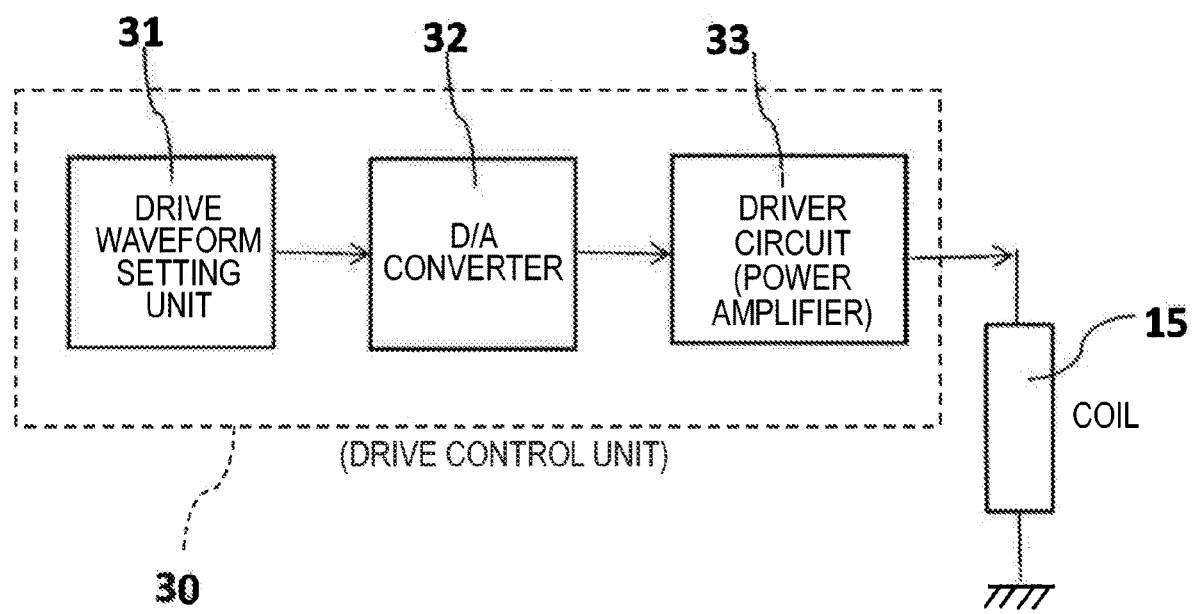
FIG. 4 is a circuit block diagram illustrating a drive control unit that drives the response force generation mechanism.

In the embodiment of the present invention, the response force generation device is constituted by the response force generation mechanism 10 fixed to the display/operation device 1 and a drive control unit 30 illustrated in FIG. 4.

As illustrated in FIG. 4, a drive waveform setting unit 31 is provided in the drive control unit 30. The drive control unit 30 is provided with a computer, and the drive waveform setting unit 31 is computer software installed in the computer. For example, the drive waveform setting unit 31 is referred to as waveform generation software, signal waveform setting software, or the like, and the drive waveform setting unit 31 sets a drive waveform representing an intensity change of a drive signal with respect to time.

The drive control unit 30 is provided with a D/A converter 32 such that the drive waveform, which is a digital signal set by the drive waveform setting unit 31, is converted into an analog value. The drive waveform converted into the analog value is applied to a driver circuit 33 having the power amplifier, and a drive current is amplified by the driver circuit 33 is applied to the drive coil 15 provided in the magnetic drive unit of the response force generation mechanism 10.

Next, operation of the response force generation device will be described.

When a finger touches any point of the display screen 4 in the display/operation device 1, the part of an image being displayed that has been touched by the finger is determined based on a coordinate detection output from the touch sensor while referring to the image displayed on the display screen 4 of the panel portion 2. When the operating force P is applied to the display screen 4 with the finger, the support metal plate 23 elastically deforms, the display/operation device 1 slightly moves in the Y direction, and the press of the display/operation device 1 is detected by the detection member 25. In a main body control unit (not illustrated), the operation that has been performed is determined by referring to the image displayed on the display screen 4 based on the detection output of the touch sensor and the detection output of the detection member 25, and a processing operation based on the intended operation is started.

When the detection member 25 detects a load based on the operating force P, an operation command is issued to the drive control unit 30 illustrated in FIG. 4 by the main body control unit. In the drive control unit 30, the drive signal set by the drive waveform setting unit 31 is converted into an analog signal by the D/A converter 32, and the drive current is applied from the driver circuit 33 to the drive coil 15 provided in the response force generation mechanism 10. In the response force generation mechanism 10, the movable portion 12 is moved in the Y direction by the drive current flowing through the drive coil 15 and a magnetic field of the magnet 14 constituting the magnetic drive unit, and a reaction force of the movement of the movable portion 12 in the Y direction is applied to the display/operation device 1, so that the operating finger feels a response force.

Incidentally, even when the operation units 5 and 6 illustrated in FIG. 1 are pressed, the drive control unit 30 is operated as necessary to apply the response force to the display/operation device 1 from the response force generation mechanism 10.

Figure 5A:
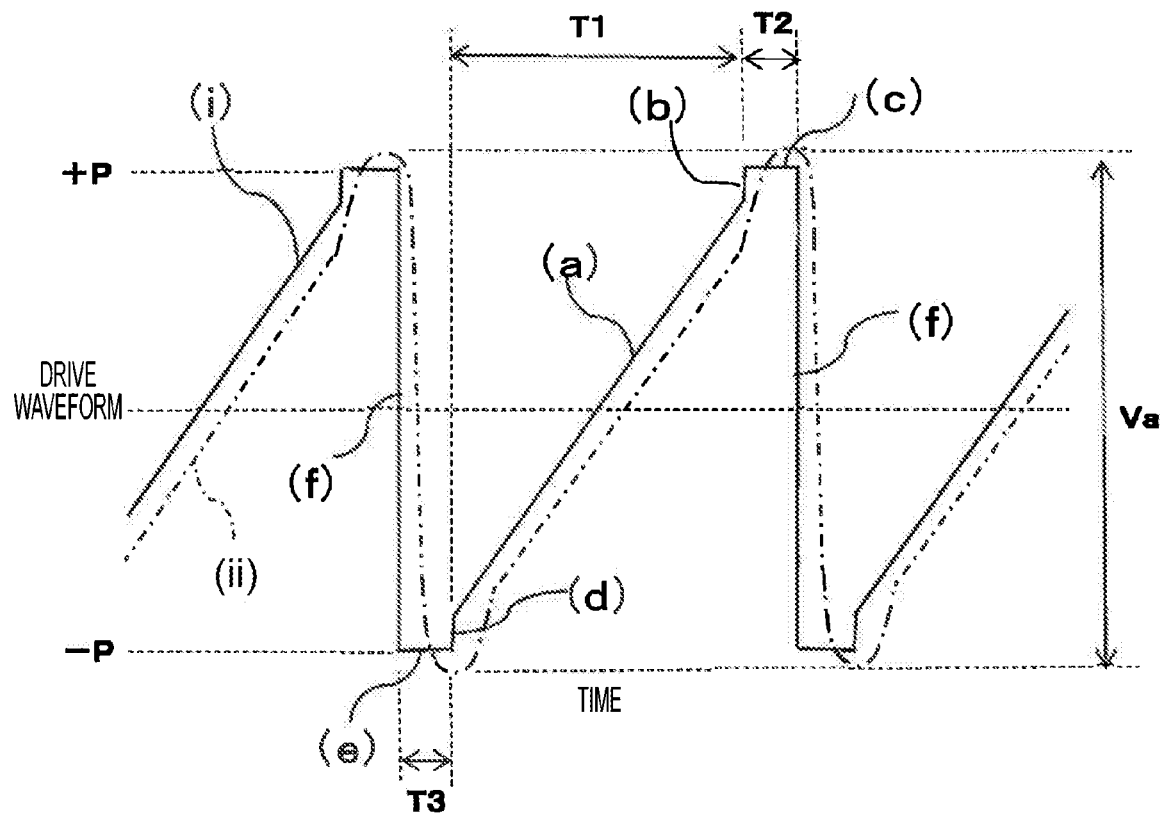
FIG. 5A is a waveform diagram illustrating a drive waveform of a first embodiment set by the drive control unit.

FIG. 5A illustrates a drive waveform (i) of a drive signal of a first embodiment set by the drive waveform setting unit 31 with a solid line. A drive current corresponding to a change in the drive waveform (i) is applied from the driver circuit 33 to the drive coil 15 of the response force generation mechanism 10. An alternate long and short dash line illustrated in FIG. 5A is a change (ii) of a voltage acting on the drive coil 15 when the drive current flows.

Figure 5B:
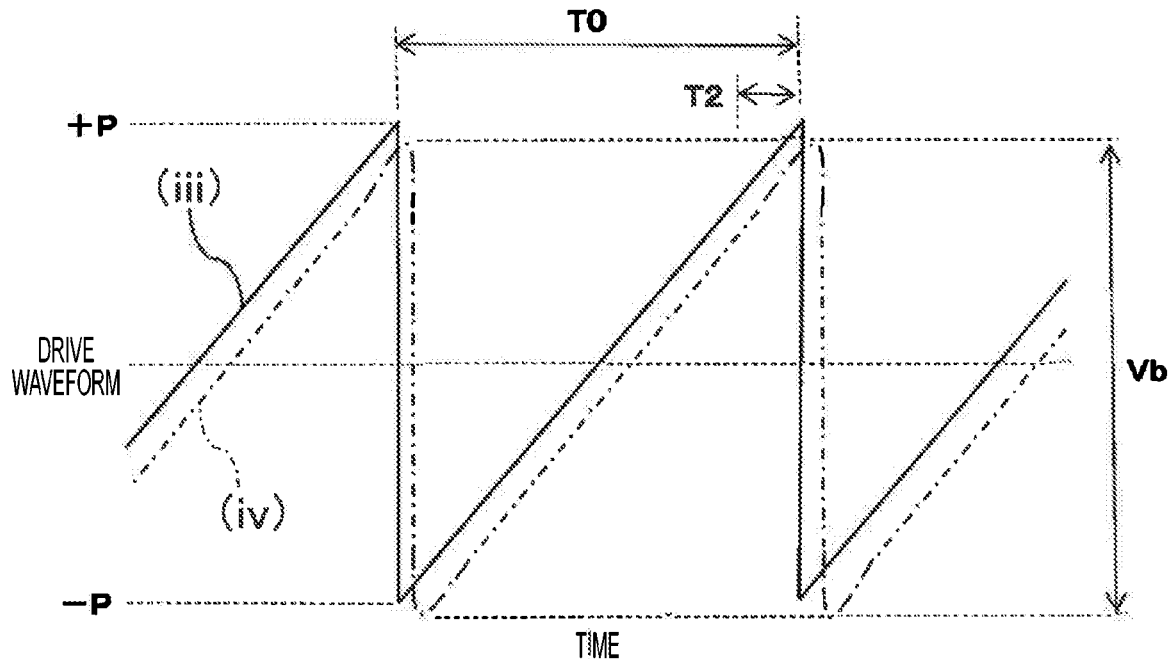
FIG. 5B is a waveform diagram illustrating a drive waveform of a comparative example.

FIG. 5B illustrates a drive waveform (iii) of the drive signal as a comparative example and a change (iv) of a voltage acting on the drive coil 15.

In the response force generation device, a drive current based on the drive waveform (i) set by the drive waveform setting unit 31 is applied to the drive coil 15 for one period at a timing at which the detection member 25 detects the operating force P. Alternatively, the drive current may be applied for a plurality of periods at the above-described timing.

The drive waveform (i) set by the drive waveform setting unit 31 includes a first drive section T1, a second drive section T2, and a third drive section T3. The first drive section T1 is a region (a) where a signal intensity of the drive signal increases with a lapse of time. As illustrated in FIG. 5A, it is preferable that the signal intensity increase linearly in the first drive section T1. However, a waveform in which the signal intensity increases in a curve may be included in the first drive section T1.

The second drive section T2 includes a peak (+P) on a positive side of the signal intensity. The second drive section T2 includes a region (b) where the drive signal abruptly rises (with a vertical waveform) and a region (c) where the signal intensity does not change but retains a value of the peak (+P) even after a lapse of time. The second drive section T2 includes the region (c) where an increase rate of the signal intensity with respect to time is lower than that in the first drive section T1.

The third drive section T3 also includes a region (e) where the signal intensity does not change and remains the peak (−P) even after a lapse of time and a region (d) where the drive signal abruptly rises (with a vertical waveform).

Regarding a drive signal (f) between the second drive section T2 and the third drive section T3, the signal intensity of the drive signal changes at a higher change rate than that in the first drive section T1, and a drive waveform thereof changes substantially along the vertical waveform from the positive-side peak (+P) to a negative-side peak (−P) for almost zero time.

The drive waveform (i) of the drive signal illustrated in FIG. 5A can be obtained by combining a so-called sawtooth wave (triangular wave) in which changes in signal regions (a) and (f) are repeated and a rectangular wave such as a change of the signal intensity in the second drive section T2 between the negative-side peak (−P) and the positive-side peak (+P) in the drive waveform setting unit 31.

In the comparative example illustrated in FIG. 5B, a drive waveform of a drive signal is a so-called sawtooth wave (triangular wave), a signal intensity of the drive signal linearly increases from a negative-side peak (−P) to a positive-side peak (+P) at a time T0, and the signal intensity changes along a vertical waveform from the positive-side peak (+P) to the negative-side peak (−P).

The signal intensities at the positive-side peak (+P) and the negative-side peak (−P) are the same in the first embodiment of FIG. 5A and the comparative example of FIG. 5B.

When comparing the drive waveform (i) of the drive signal of the first embodiment illustrated in FIG. 5A with a drive waveform (iii) of the drive signal of the comparative example illustrated in FIG. 5B, an increase rate of the drive signal with respect to a lapse of time in the first drive section T1 of the drive waveform (i) is the same as an increase rate of the drive signal with respect to a lapse of time in the drive waveform (iii) at the time T0, and both drive signals change linearly.

When comparing the change of the signal intensity in the second drive section T2 between the drive waveform (i) of the drive signal of the first embodiment and the drive waveform (iii) of the comparative example, the signal intensity of the drive waveform (iii) shows the increase rate of the linear function towards the positive-side peak (+P), and the waveform has a shape that is sharp like at a distal end of a blade at positive-side peak (+P) while the drive waveform (i) is the rectangular wave.

That is, the peak value (+P) of the signal intensity is retained in the region (c) of the second drive section T2, and the increase rate of the signal intensity with respect to the lapse of time in the second drive section T2 is lower than that in the first drive section T1 in the drive waveform (i) of FIG. 5A. In the drive waveform (iii) of FIG. 5B, however, the increase rate of signal intensity in the second drive section T2 is the same as that in the first drive section T1. Thus, the drive waveform (i) illustrated in FIG. 5A more easily follows the frequency characteristics of the driver circuit 33 illustrated in FIG. 4 than the drive waveform (iii) illustrated in FIG. 5B.

In addition, an integral value obtained by integrating signal intensities with time in the second drive section T2 of the drive waveform (i) in FIG. 5A is larger than an integral value similarly obtained in the second drive section T2 of the drive waveform (iii) of FIG. 5B. Thus, the drive waveform (i) can increase power (drive energy) to be applied to the drive coil 15 in the vicinity of the positive-side peak (+P) as compared with the drive waveform (iii).

Similarly, the change of the signal intensity of the drive signal in the third drive section T3 is gentler than that in the first drive section T1 as illustrated in FIG. 5A. Even in the third drive section T3, an integral value obtained by integrating signal intensities with time in FIG. 5A is larger than an integral value similarly obtained in the vicinity of the negative-side peak (−P) of the drive waveform (iii) in FIG. 5B.

As a result, a voltage Va acting on the drive coil 15 when a drive current is caused to flow to the drive coil 15 using the drive waveform (i) of the first embodiment illustrated in FIG. 5A can be set to be larger than a voltage Vb acting on the drive coil 15 when the drive waveform (iii) of the comparative example illustrated in FIG. 5B is used. Accordingly, it is possible to increase the kinetic energy in the Y direction to be applied to the movable portion 12 and to drive the movable portion 12 with a large acceleration within a defined amplitude in the response force generation mechanism 10 illustrated in FIG. 3. Since the kinetic energy of the movable portion 12 is large, it is possible to apply the reaction force with respect to the movement of the movable portion 12 as a large force to the display/operation device 1.

Further, it is possible to increase the operating speed of the movable portion 12 if the drive waveform is set such that the increase rate of the signal intensity in the first drive section T1 is high and a rise angle of the straight line of the linear function is large, so that it is possible to apply a responsive force with a sharp feeling and a large force to the finger operating the display screen 4 or the operation units 5 and 6 even if the mass of the display/operation device 1 is large. As a result, it is also possible to apply the response force with a feeling, which is similar to a feeling obtained when a mechanical switch having a dome type reversing contact is pressed by a finger to operate, to the finger applying the operating force P.

Figure 6A:
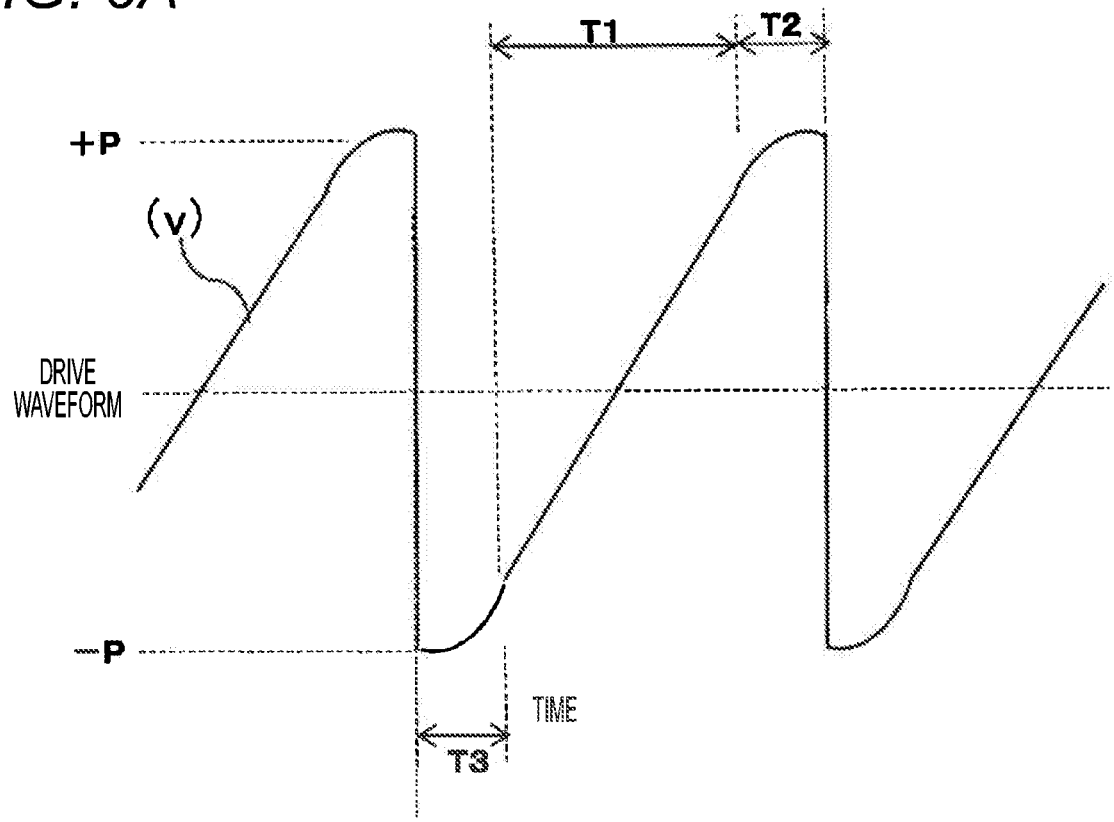
FIG. 6A is a waveform diagram illustrating a drive waveform of a second embodiment set by the drive control unit.
Figure 6B:
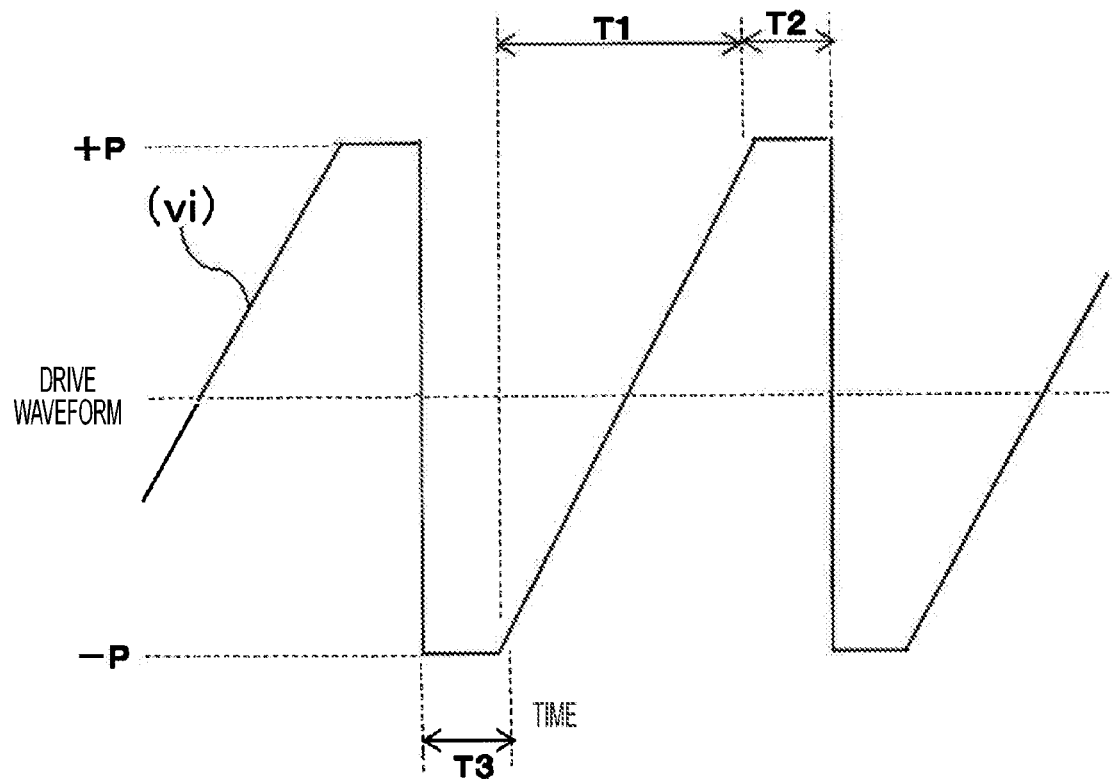
FIG. 6B is a waveform diagram illustrating a drive waveform of a third embodiment set by the drive control unit.

FIG. 6A illustrates a drive waveform (v) of a drive signal of a second embodiment, and FIG. 6B illustrates a drive waveform (vi) of a drive signal of a third embodiment.

In the drive waveform (v) illustrated in FIG. 6A, a signal intensity changes with a curve trajectory with respect to a lapse of time in the second drive section T2, and an increase rate of the signal intensity in the second drive section T2 is lower than an increase rate in the first drive section T1. The similar description is also applied in the third drive section T3.

In the drive waveform (vi) illustrated in FIG. 6B, a value of the positive-side peak (+P) is retained for a predetermined time in the second drive section T2. Therefore, an increase rate of the signal intensity in the second drive section T2 is lower than an increase rate in the first drive section T1. The similar description is also applied in the third drive section T3.

Even when the drive waveforms illustrated in FIGS. 6A and 6B are used, it is possible to increase a voltage to be applied to the drive coil 15, and it is possible to make the finger feel a response force as if a mechanical switch was operated by operating the movable portion 12 with a large acceleration.

Although the member to be operated is the display/operation device 1 in the above-described embodiment, the member to be operated is not limited thereto. For example, a part of an instrument panel provided in a passenger compartment of an automobile may be a member to be operated provided with a capacitive sensor.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A response force generation device comprising:
   a response force generation mechanism which is attached to a member to be operated at least a part of which is configured as an operation unit and applies a response force to the member to be operated; and
   a drive control unit configured to drive the response force generation mechanism,
   wherein the response force generation mechanism has a movable portion and a magnetic drive unit configured to operate the movable portion,
   the drive control unit sets a drive waveform for changing a signal intensity of a drive signal to be supplied to the magnetic drive unit, and
   the drive waveform has a first drive section in which the signal intensity increases in accordance with a lapse of time at an increase rate and a second drive section including a peak of the signal intensity, and the second drive section includes a region in which an increase rate of the signal intensity with respect to time is lower than the increase rate of the first drive section.

2. The response force generation device according to claim 1, wherein
   the drive signal changes linearly in the first drive section.

3. The response force generation device according to claim 1, wherein
a waveform of the drive signal is a rectangular wave in the second drive section.

4. The response force generation device according to claim 1, wherein
the second drive section includes a region in which the signal intensity of the drive signal does not change.

5. The response force generation device according to claim 1, wherein
the second drive section includes a region in which the intensity of the drive signal changes in a curve.

6. A response force generation device comprising:
a response force generation mechanism which is attached to a member to be operated at least a part of which is configured as an operation unit and applies a response force to the member to be operated; and
a drive control unit configured to drive the response force generation mechanism,
wherein the response force generation mechanism has a movable portion and a magnetic drive unit configured to operate the movable portion,
the drive control unit sets a drive waveform for changing a signal intensity of a drive signal to be supplied to the magnetic drive unit, and
the drive waveform has a first drive section in which the signal intensity increases in accordance with a lapse of time at an increase rate, a second drive section following the first drive section and including a peak of the signal intensity, and a third drive section preceding the first drive section, wherein the second drive section and the third drive section each includes a region in which an increase rate of the signal intensity with respect to time is lower than the increase rate of the first drive section.

7. The response force generation device according to claim 6, wherein
the drive signal changes linearly in the first drive section and in the third drive section.

8. The response force generation device according to claim 6, wherein
a waveform of the drive signal is a rectangular wave in the second drive section and in the third drive section.

9. The response force generation device according to claim 6, wherein
the second drive section and the third drive section each includes a region in which the signal intensity of the drive signal does not change.

10. The response force generation device according to claim 6, wherein
the second drive section and the third drive section each includes a region in which the intensity of the drive signal changes in a curve.

11. A response force generation device comprising:
a response force generation mechanism which is attached to a member to be operated at least a part of which is configured as an operation unit and applies a response force to the member to be operated; and
a drive control unit configured to drive the response force generation mechanism,
wherein the response force generation mechanism has a movable portion and a magnetic drive unit configured to operate the movable portion,
the drive control unit sets a drive waveform for changing a signal intensity of a drive signal to be supplied to the magnetic drive unit, and
the drive waveform has a first drive section in which the signal intensity increases in accordance with a lapse of time at an increase rate, a second drive section following the first drive section and including a peak of the signal intensity, and a third drive section preceding the first drive section, wherein the second drive section includes a region in which an increase rate of the signal intensity with respect to time is lower than the increase rate of the first drive section and the third drive section has the same shape as the second drive section.

12. The response force generation device according to claim 11, wherein
the drive signal changes linearly in the first drive section.

13. The response force generation device according to claim 11, wherein
a waveform of the drive signal is a rectangular wave in the second drive section and in the third drive section.

14. The response force generation device according to claim 11, wherein
the second drive section and the third drive section each includes a region in which the signal intensity of the drive signal does not change.

15. The response force generation device according to claim 11, wherein
the second drive section and the third drive section each includes a region in which the intensity of the drive signal changes in a curve.

* * * * *